(12) United States Patent
Chen

(10) Patent No.: US 8,154,860 B2
(45) Date of Patent: Apr. 10, 2012

(54) FOOT PAD STRUCTURE

(75) Inventor: Shun-Bin Chen, Taipei County (TW)

(73) Assignee: Acer Incorporated, Taipei County (TW)

( * ) Notice: Subject to any disclaimer, the term of this patent is extended or adjusted under 35 U.S.C. 154(b) by 160 days.

(21) Appl. No.: 12/699,269

(22) Filed: Feb. 3, 2010

(65) Prior Publication Data

US 2011/0102981 A1    May 5, 2011

(30) Foreign Application Priority Data

Nov. 5, 2009  (TW) .............................. 98137648 A

(51) Int. Cl.
G06F 1/16 (2006.01)
(52) U.S. Cl. ........ 361/679.01; 174/50; 135/66; 248/146
(58) Field of Classification Search ............. 361/679.01, 361/679.4, 679.41, 679.42, 679.31, 679.55, 361/679.57; 174/50, 17 CT; 135/66, 76, 135/84, 75; 248/121, 170, 346.2, 168, 146, 248/615; 623/17.16, 17.12; 36/43, 44, 147, 36/181
See application file for complete search history.

(56) References Cited

U.S. PATENT DOCUMENTS

| 6,979,778 B2* | 12/2005 | Xiong et al. .................... 174/50 |
| 2010/0319740 A1* | 12/2010 | Willey ............................. 135/66 |

* cited by examiner

*Primary Examiner* — Hung Duong
(74) *Attorney, Agent, or Firm* — WPAT, P.C.; Anthony King

(57) ABSTRACT

A foot pad structure includes a retaining member and an elastic pad member. The retaining member is mounted to a receiving portion formed on a bottom of an electronic system and has a second through hole communicable with a first through hole formed in the receiving portion to thereby communicate with external environment via the first through hole. The elastic pad member internally defines an air chamber that communicates with the second through hole. The elastic pad member is retained between the retaining member and the receiving portion with a lower part thereof downward protruded beyond the receiving portion. When the elastic pad member is compressed, air in the air chamber is expelled into the external environment via the first and second through holes, allowing the elastic pad member to deform for the electronic system to stably position on a work surface without wobbling when the electronic system is operated.

19 Claims, 14 Drawing Sheets

FOOT PAD STRUCTURE

FIELD OF THE INVENTION

The present invention relates to a foot pad structure, and more particularly to a foot pad structure for mounting to a bottom of an electronic system.

BACKGROUND OF THE INVENTION

Many electronic systems have stabilizing or wear-resisting foot pads mounted to a bottom thereof. In the prior art, such foot pads are usually made of a rubber or plastic material and are bonded to the bottom of the electronic systems by heat melting the rubber or plastic foot pads.

It is frequently found that a fully assembled electronic system, such as a notebook computer, fails to have all the foot pads thereof in contact with a supporting plane, such as a disk top. With one of the foot pads thereof suspended in the air, the electronic system positioned on the supporting plane is actually in an unstable state. This condition might be caused by errors in manufacturing a bottom cover of the electronic system, such as errors in thermal injection molding or thermal die-casting, which would adversely affect the structural strength and the levelness of the bottom cover to result in deformation thereof. Further, errors in assembling and unevenly distributed weight on the bottom cover would also render the electronic system in a non-level state. Particularly, the currently very popular small notebook computers, netbook computers, mobile Internet devices, and ultra-mobile personal computers, due to their small size, tend to wobble easily when they are positioned on a work surface in a non-level condition, preventing a user from comfortably operating or keying on them.

It is therefore desirable to develop a foot pad structure for electronic systems to overcome the above-mentioned problems.

SUMMARY OF THE INVENTION

A primary object of the present invention is to provide a foot pad structure for mounting to a bottom of an electronic system, such as a notebook computer, so that the electronic system would not wobble when a user operates thereon even if the bottom of the electronic system is in a non-level condition due to manufacturing or assembling errors of the electronic system or positioning of the electronic system on a non-planar surface.

To achieve the above and other objects, the foot pad structure according to an embodiment of the present invention is designed for mounting to a receiving portion formed on a bottom of an electronic system. The receiving portion has a base wall, a surrounding wall and a first through hole. The surrounding wall is outward extended from the base wall, and the first through hole is extended through the receiving portion. The foot pad structure includes a retaining member and an elastic pad member. The retaining member is mounted to the receiving portion and is provided with a second through hole communicable with the first through hole. The elastic pad member is a hollow member having a top opening, via which the elastic pad member is disposed around the retaining member, and an elastic compressible portion is located below the top opening. The compressible portion is downward protruded beyond the receiving portion when the retaining member is mounted to the receiving portion, and internally defines a hollow air chamber, which is communicable with the second through hole.

To achieve the above and other objects, the foot pad structure according to another embodiment of the present invention is designed for mounting to a receiving portion formed on a bottom of an electronic system. The receiving portion has a base wall and a surrounding wall, and the surrounding wall is outward extended from the base wall and has a longitudinally extended groove provided on an inner wall surface thereof. The foot pad structure includes a retaining member and an elastic pad member. The retaining member is mounted to the receiving portion and is provided with a second through hole communicable with the groove. The elastic pad member is a hollow member having a top opening, via which the elastic pad member is disposed around the retaining member, and an elastic compressible portion located below the top opening. The compressible portion is downward protruded beyond the receiving portion when the retaining member is mounted to the receiving portion, and internally defines a hollow air chamber, which is communicable with the second through hole.

A secondary object of the present invention is to provide an electronic system having a foot pad structure mounted to a bottom of the electronic system, such as a notebook computer, so that the electronic system would not wobble when a user operates thereon even if the bottom of the electronic system is in a non-level condition due to manufacturing or assembling errors of the electronic system or positioning of the electronic system on a non-planar surface.

To achieve the above and other objects, an electronic system is provided according to an embodiment of the present invention. The electronic system has a receiving portion and a foot pad structure provided on a bottom of the electronic system. The receiving portion has a base wall, a surrounding wall, and a first through hole. The surrounding wall is outward extended from the base wall, and the first through hole is extended through the receiving portion. The foot pad structure has a retaining member and an elastic pad member. The retaining member is mounted to the receiving portion and is provided with a second through hole communicable with the first through hole. The elastic pad member is a hollow member having a top opening, via which the elastic pad member is fitted around the retaining member, and an elastic compressible portion is located below the top opening, the compressible portion is downward protruded beyond the receiving portion when the retaining member is mounted to the receiving portion, and the compressible portion internally defines an air chamber, which is communicable with the second through hole.

With the air chamber and the through holes provided on the foot pad structure of the present invention, when the elastic pad member is compressed by an external force, part of the air stored in the air chamber can be expelled via the communicating through holes into external environment, allowing the elastic pad member to have high compressive deformation. That is, the foot pad structure of the present invention is able to modify any non-levelness of an electronic system caused by unevenly distributed weight thereof, so that the electronic system can always be stably positioned on a work plane without wobbling when a user operates, such as types on the electronic system.

BRIEF DESCRIPTION OF THE DRAWINGS

The structure and the technical means adopted by the present invention to achieve the above and other electronic systems can be best understood by referring to the following detailed description of the preferred embodiments and the accompanying drawings, wherein.

DETAILED DESCRIPTION OF THE PREFERRED EMBODIMENTS

Figure 1:
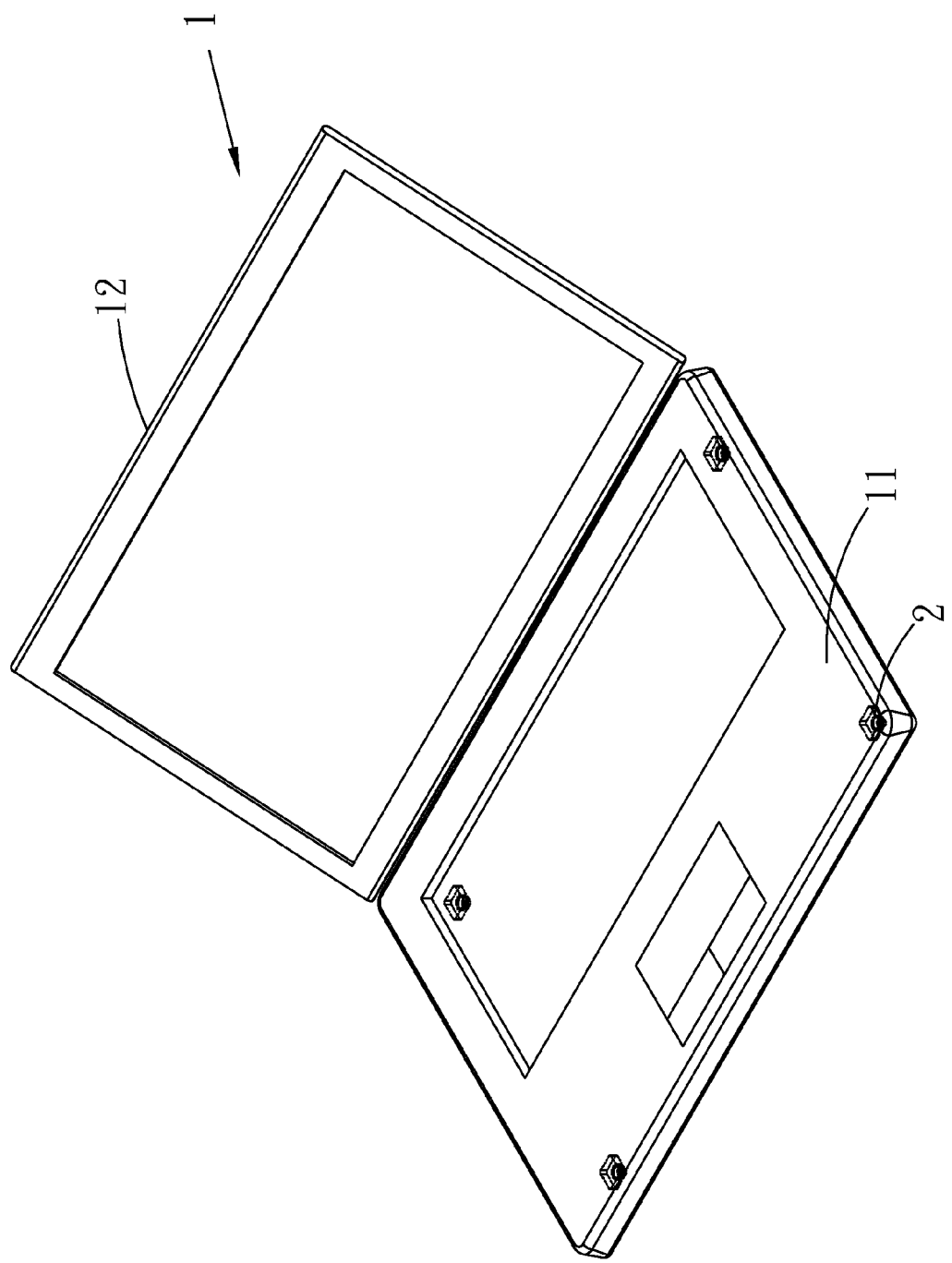
FIG. 1 shows the foot pad structure according to the present invention can be externally mounted to different locations at a bottom of an electronic system.
Figure 2:
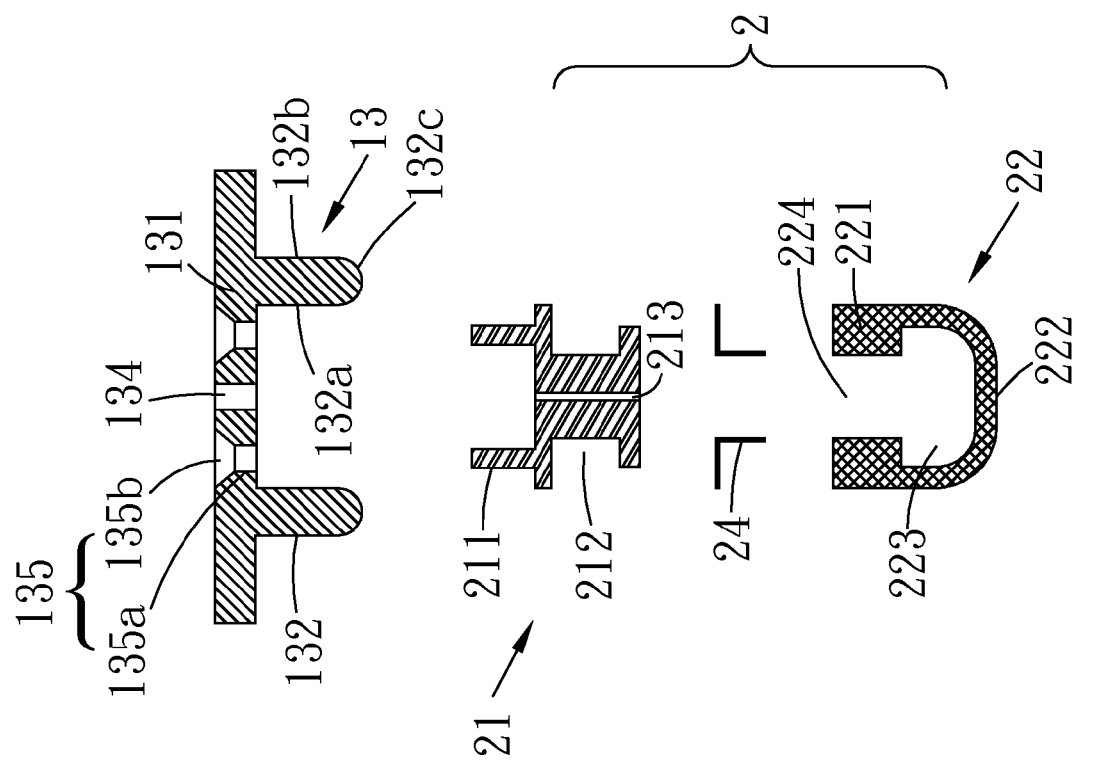
FIG. 2 is an exploded sectional view of a foot pad structure according to a first embodiment of the present invention.

Please refer to FIG. 1 that generally shows the foot pad structure according to the present invention can be externally mounted to different locations at a bottom of an electronic system; and to FIG. 2 that is an exploded sectional view showing a foot pad structure 2 according to a first embodiment of the present invention. As shown, the foot pad structure 2 is assembled from a retaining member 21 and an elastic pad member 22 for externally mounting to a bottom of an electronic system 1. In the illustrated first embodiment, the electronic system 1 can be a notebook computer, a netbook computer, a mobile Internet device, or an ultra-mobile personal computer (UMPC). The electronic system 1 has a housing, and the housing comprises a base portion 11, a pivotal cover portion 12 turnable relative to the base portion 11. The electronic system 1 further comprises a plurality of receiving portions 13, to each of which one foot pad structure 2 of the present invention is correspondingly mounted. In the illustrated first embodiment, the receiving portions 13 are integrally formed on the base portion 11 of the electronic system 1. However, the receiving portions 13 can also be formed on the base portion 11 in other different manners.

The bottom of the base portion 11 of the electronic system 1 also serves as a base wall 131 of the receiving portions 13. The receiving portion 13 includes a surrounding wall 132 that is integrally outward extended from the bottom of the base portion 11, and a first through hole 134 that extends through the base wall 131 in a thickness direction thereof. The surrounding wall 132 has an inner wall surface 132a, an outer wall surface 132b, and a connecting wall surface 132c connected to and extended between the inner and the outer wall surface 132a, 132b.

The base wall 131 located inside the surrounding wall 132 is provided with at least one position limiting hole 135 extended through the base wall 131 in a thickness direction thereof. In the illustrated first embodiment, two position limiting holes 135 are shown. Each of the position limiting holes 135 has a lower neck portion 135a and an upper flared portion 135b that is extended from an upper end of the neck portion 135a.

The retaining member 21 of the foot pad structure 2 is mounted to and located in the receiving portion 13, and includes at least one retaining pin 211, a locating recess 212, and a second through hole 213. In the illustrated first embodiment, two retaining pins 211 are shown. The retaining pins 211 are upward extended from an upper end surface of the retaining member 21 for extending into the neck portions 135a of the position limiting holes 135. The locating recess 212 is externally disposed around a sidewall of the retaining member 21 for fixedly holding the elastic pad member 22 thereto, so that the elastic pad member 22 is fitted in the receiving portion 13 via the retaining member 21. The second through hole 213 longitudinally extends through the retaining member 21 to locate between the upper end surface and a lower end surface of the retaining member 21. The second through hole 213 is communicable with the first through hole 134, allowing ambient air to flow into an inner space of the elastic pad member 22 via the first and the second through hole 134, 213.

Figure 3:
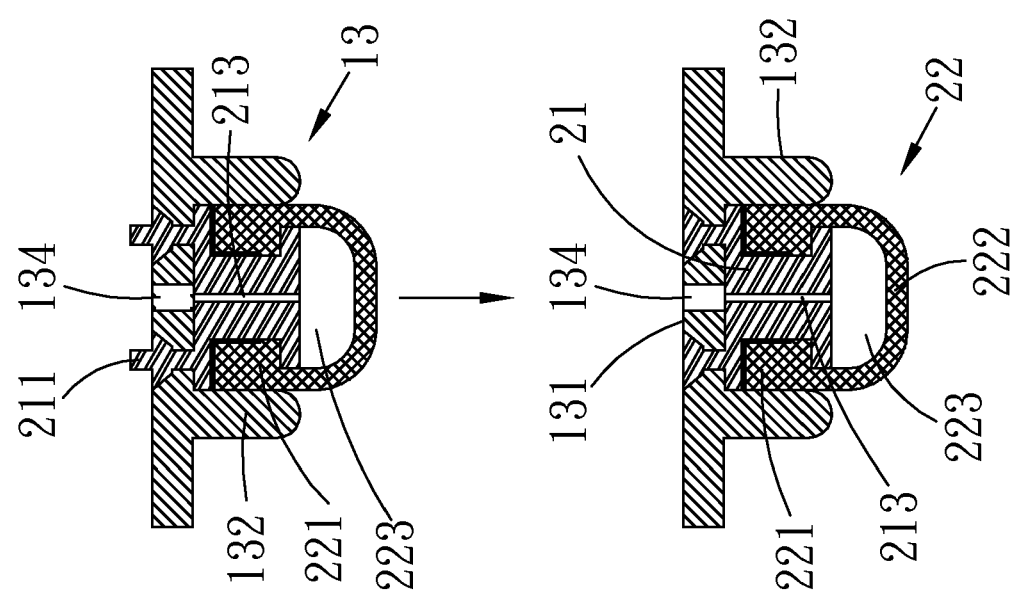
FIG. 3 shows the manner of assembling the foot pad structure of FIG. 2.

The retaining member 21 can be made of a thermosetting plastic material. When the retaining member 21 has been mounted to the receiving portion 13, the retaining pins 211 in the neck portions 135a are heated to a molten state, so that the retaining pins 211 in the molten state fill up the flared portions 135b. When the molten retaining pins 211 become cooled and set again, the retaining member 21 is tightly retained in the receiving portion 13, as shown in FIG. 3.

The elastic pad member 22 is a hollow member having a locating portion 221, a compressible portion 222, and an air chamber 223 with a top opening 224. The locating portion 221 is formed along an inner periphery of the top opening 224 to provide a radially inward protruded flange adapted to engage with the locating recess 212 on the retaining member 21, such that the elastic pad member 22 can be fitted around the retaining member 21 via the top opening 224 with the locating portion 221 received in the locating recess 212 and then further fitted inside the inner wall surface 132a of the receiving portion 13 via the retaining member 21. A gluing material 24 can be further applied over a contact surface between the locating recess 212 and the locating portion 221 to ensure tight and secure connection of the locating recess 212 to the locating portion 221.

The compressible portion 222 possesses a predetermined degree of elasticity and is located below the locating portion 221 to downward protrude beyond the receiving portion 13 when the foot pad structure 2 has been fully mounted to the receiving portion 13. The hollow air chamber 223 is defined in the compressible portion 222 and allows the compressible portion 222 subjected to an external force to be compressed inward against the air chamber 223 and to elastically restore an original shape when the external force is released. The elastic pad member 22 can be made of a rubber material to possess high elasticity. The air chamber 223 is located between the retaining member 21 and the compressible portion 222 of the elastic pad member 22 and communicates with the second through hole 213, such that air can flow into or out of the air chamber 223 via the second through hole 213 and the first through hole 134 to maintain the air chamber 223 at a desired internal pressure value.

Figure 4:
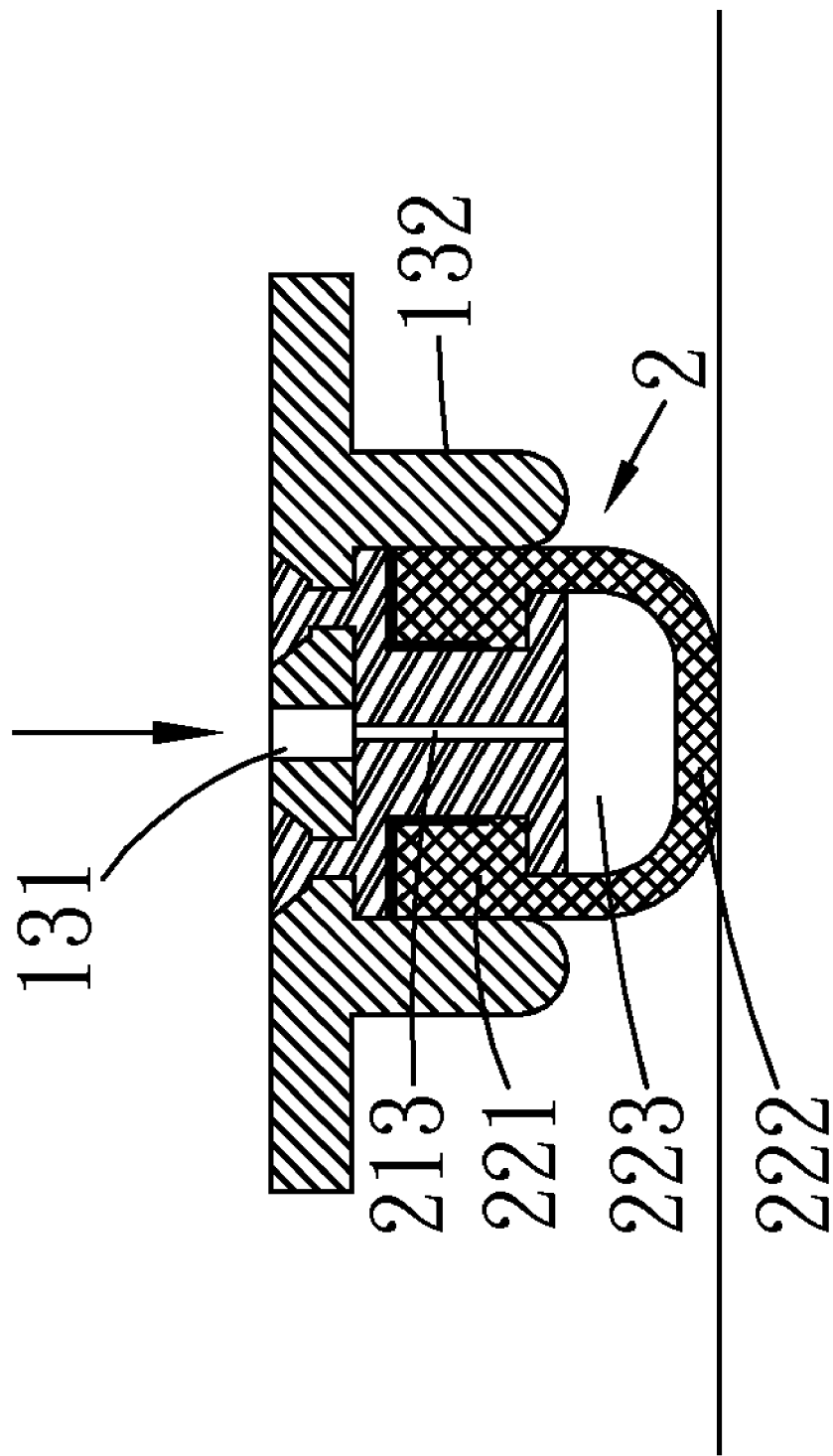
FIGS. 4 and 5 show how the foot pad structure of FIG. 2 operates.
Figure 5:
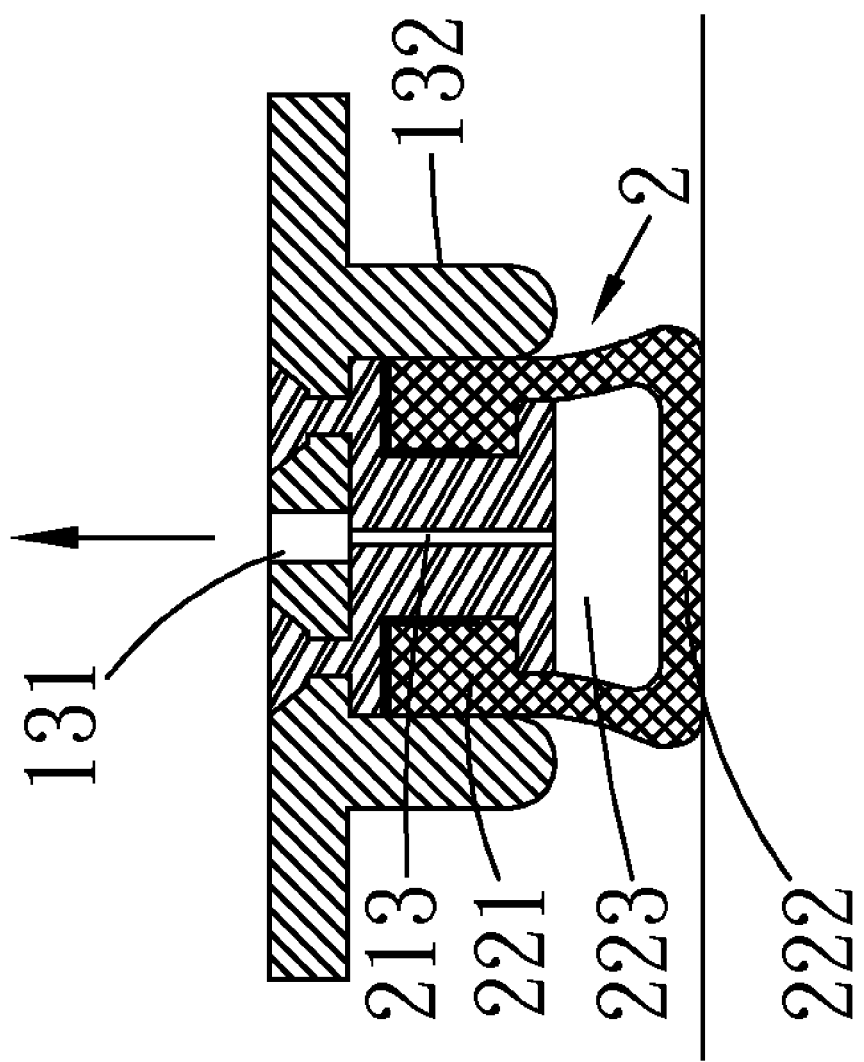

FIGS. 4 and 5 show how the foot pad structure 2 according to the first embodiment of the present invention operates. As shown, when the foot pad structure 2 is mounted to the bottom of the electronic system 1 (not shown in FIGS. 4 and 5) and the electronic system 1 is positioned on a desk top or a floor surface, weight applied by the electronic system 1 to the foot pad structure 2 causes the desk top or the floor surface to generate a reverse force, which upward pushes against the compressible portion 222 of the elastic pad member 22, bringing the compressible portion 222 to move toward the base wall 131 and become deformed. Meanwhile, the air chamber 223 is compressed by the deformed compressible portion 222 to have a reduced volume, forcing air inside the air chamber 223 to sequentially flow through the second and the first through hole 213, 134 to external environment, so that the pressure in the air chamber 223 keeps balanced with the external atmospheric pressure. In the above process, the air chamber 223 functions like a damper to prevent the electronic system 1 from wobbling when the electronic system is positioned on a non-level surface. With the air chamber 223, the elastic pad member 22 can produce a compressive deformation higher that the prior art foot pads.

When the elastic pad member 22 is released from the compression by a force externally applied thereto, the compressible portion 222 thereof automatically moves in a direction opposite to the base wall 13 to expand the volume of the air chamber 223. When the volume of the air chamber 223 is expanded, external air automatically flows through the first and the second through hole 134, 213 into the air chamber 223, so that the air chamber 223 has internal pressure balanced with the external atmospheric pressure, allowing the elastic pad member 22 to restore its original shape. Similarly, the air chamber 223 functions like a damper in the above process to prevent the electronic system 1 from wobbling when the electronic system 1 is positioned on a non-level support surface.

When the electronic system 1 is positioned on a work surface, and either the electronic system 1 has an uneven bottom, or the work surface is uneven, or the electronic system 1 has unevenly distributed weight and accordingly an unstable center of gravity, the compressible portions 222 of the foot pad structures 2 mounted to the bottom of the electronic system 1 each are able to produce a different compressive deformation corresponding to the surface in contact therewith, so that all the foot pad structures 2 are in contact with the work surface for the electronic system 1 to stably position on the work surface without wobbling during operation thereof. Therefore, unlike the prior art foot pads, the foot pad structure of the present invention is not restricted by the principle that three points are coplanar and can therefore eliminate the condition of having one of four foot pads in a suspended state, allowing the electronic system 1 to be operated without the problem of system wobbling even if the electronic system 1 is positioned on a non-level work surface.

Figure 6:
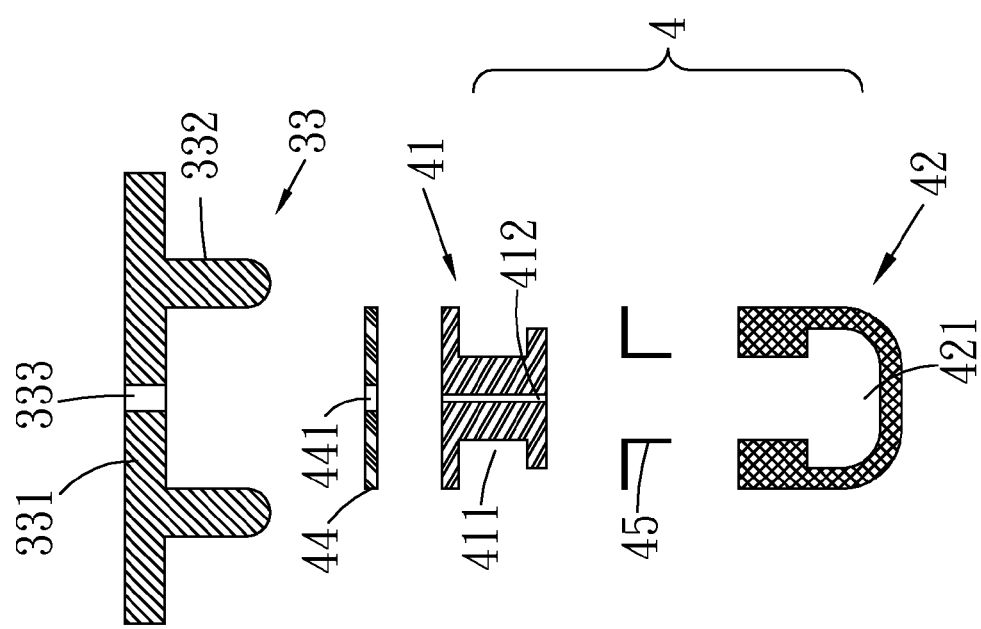
FIG. 6 is an exploded sectional view of a foot pad structure according to a second embodiment of the present invention.
Figure 7:
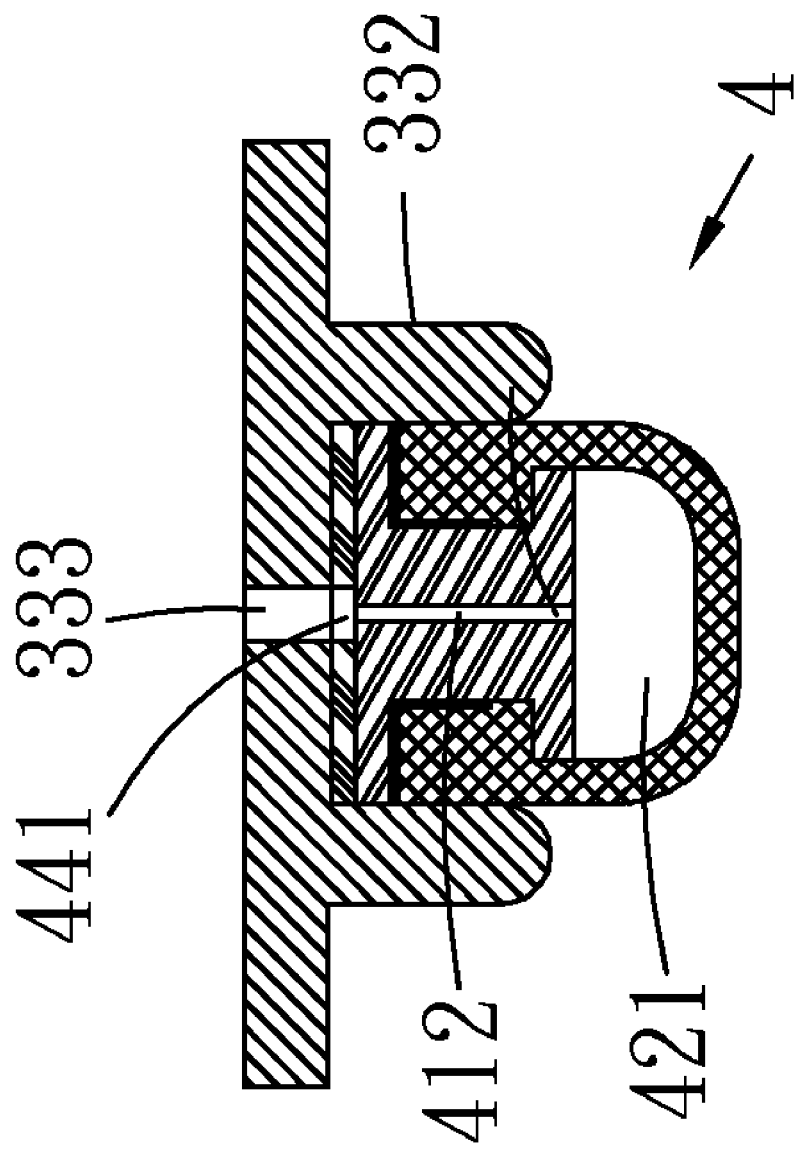
FIG. 7 is an assembled view of FIG. 6.

Please refer to FIGS. 6 and 7 that are exploded and assembled sectional views, respectively, of a foot pad structure according to a second embodiment of the present invention. In the illustrated second embodiment, the electronic system (not shown) has a plurality of receiving portions 33 provided on a bottom of a base portion thereof. The bottom of the base portion serves as a base wall 331 of the receiving portions 33. At each of the receiving portions 33, a surrounding wall 332 is outward extended from the base wall 331, and a first through hole 333 is extended through the base wall 331 in a thickness direction thereof.

The foot pad structure 4 includes a retaining member 41 and an elastic pad member 42. The retaining member 41 is mounted to the receiving portion 33, and includes a locating recess 212 externally disposed around a sidewall thereof and a second through hole 412 communicable with the first through hole 333. The elastic pad member 42 defines an air chamber 421 therein. And, a gluing material 45 can be further applied between the elastic pad member 42 and the retaining member 41 to firmly adhere them to each other. Since the elastic pad member 42 is structurally and functionally similar to the elastic pad member 22 in the first embodiment, it is not described in details herein.

The foot pad structure 4 of the second embodiment is different from the first embodiment in that it further has a binding member 44, which can be, for example, an adhesive with one side adhered to the receiving portion 13 and another opposing side adhered to the retaining member 41, such that the retaining member 41 is firmly attached by a binding force of the binding member 44 to the base wall 331 inside the surrounding wall 332 without the risk of separating from the base wall 331 by an external force.

The binding member 44 is provided with a third through hole 441, which is communicable with the first and the second through hole 333, 412 for the air chamber 421 to communicate with external environment and serve as an air cushion structure, allowing the foot pad structure 4 to have high compressibility.

Figure 8:
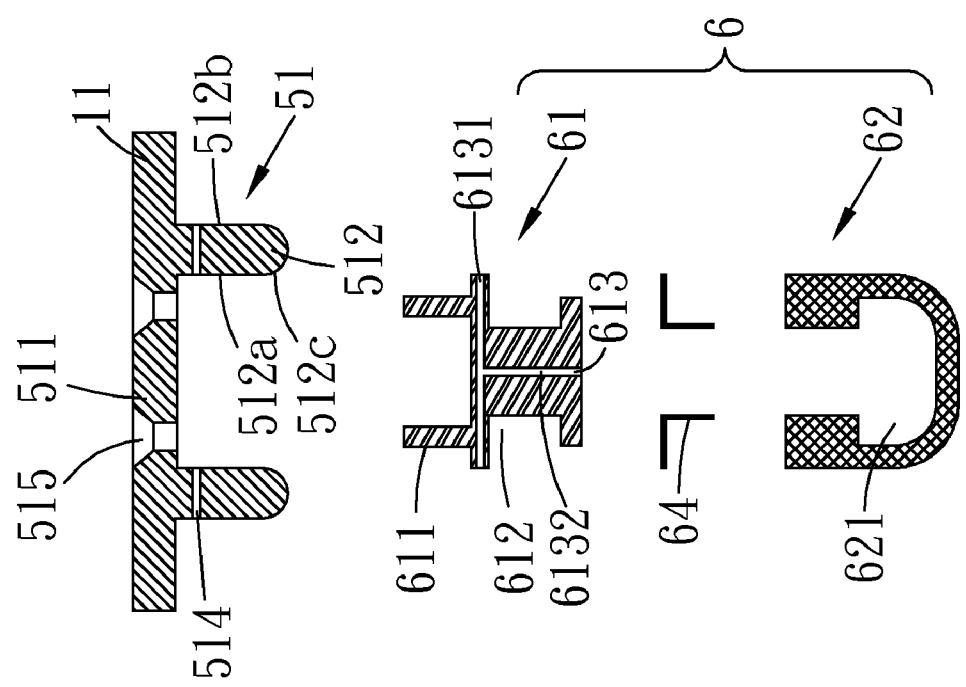
FIG. 8 is an exploded sectional view of a foot pad structure according to a third embodiment of the present invention.
Figure 9:
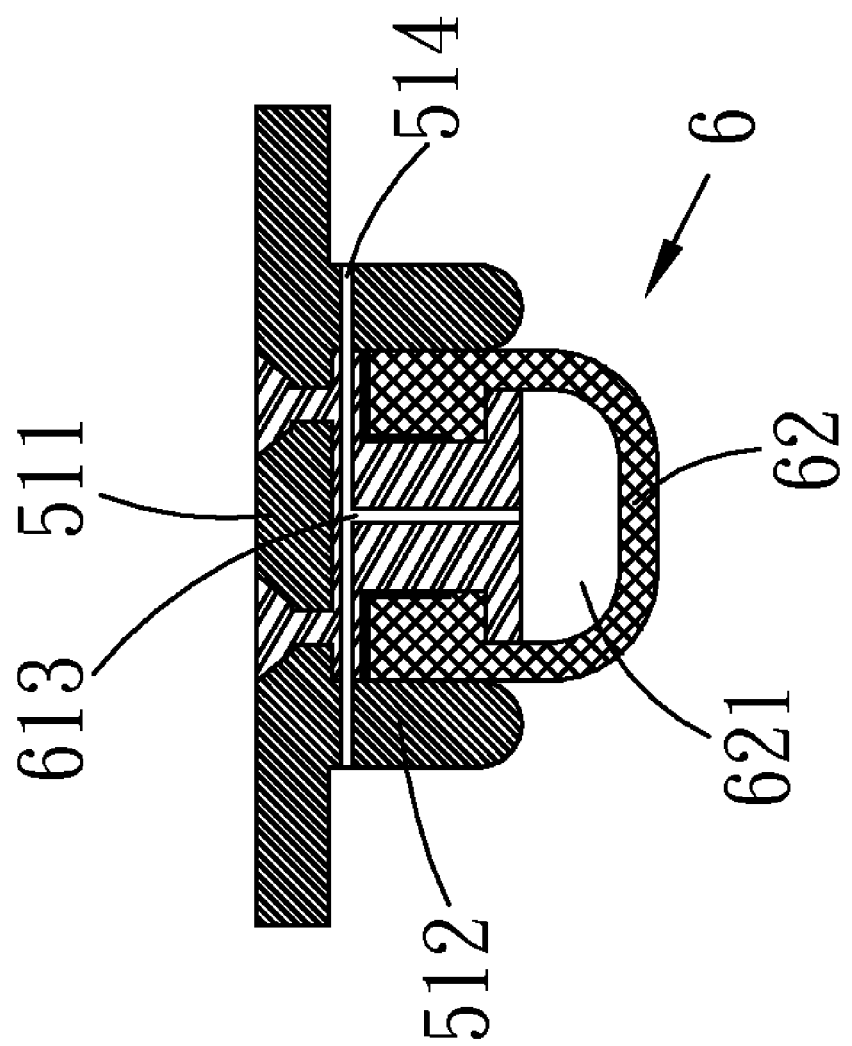
FIG. 9 is an assembled view of FIG. 8.

FIGS. 8 and 9 are exploded and assembled sectional views, respectively, of a foot pad structure according to a third embodiment of the present invention. As shown, in the illustrated third embodiment, the electronic system (not shown) has a plurality of receiving portions 51 provided on a bottom of a base portion thereof. The bottom of the base portion serves as a base wall 511 of the receiving portions 51. Each of the receiving portions 51 includes, in addition to the base wall 511, a surrounding wall 512, a first through hole 514, and at least one position limiting hole 515. In the illustrated third embodiment, two position limiting holes 515 are shown. The surrounding wall 512 has an inner wall surface 512a, an outer wall surface 512b, and a connecting wall surface 512c. The foot pad structure 6 includes a retaining member 61, an elastic pad member 62, and a gluing material 64. The retaining member 61 includes at least one retaining pin 611, a locating recess 612, and a second through hole 613. In the illustrated third embodiment, two retaining pins 611 are shown. The elastic pad member 62 defines an air chamber 621 therein.

In the third embodiment, the base wall 511, the surrounding wall 512 and the position limiting holes 515 of the receiving portion 51 as well as the retaining pins 611 and the locating recess 612 of the retaining member 61 are structurally and functionally similar to the first embodiment, and are therefore not described in details herein.

The third embodiment is different from the first embodiment in that the first through hole 514 is extended through the surrounding wall 512 in a thickness direction thereof to locate between the inner and the outer wall surface 512a, 512b; and that the second through hole 613 comprising a transverse through hole 6131 and a vertical through hole 6132. The transverse through hole 6131 transversely extends through between two opposite sidewalls at an upper end of the retaining member 61 to communicate with the first through hole 514, and the vertical through hole 6132 longitudinally extends between the transverse through hole 6131 and a lower end of the retaining member 61, such that air in the air chamber 621 is communicable with ambient air via the first and the second through hole 514, 613, allowing the foot pad structure 6 to serve as an air cushion.

Figure 10:
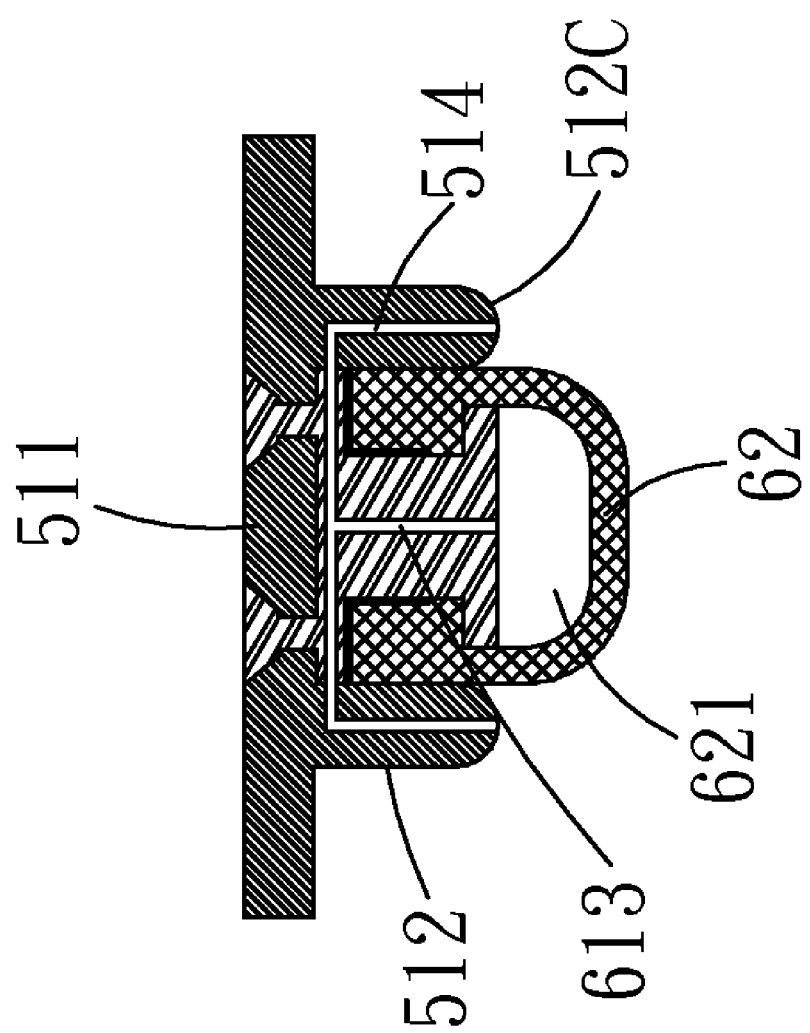
FIG. 10 is an assembled sectional view showing a variation of the third embodiment of the present invention.

Please refer to FIG. 10 that shows a variation of the third embodiment of the present invention. In this variation of the third embodiment, the first through hole 514 has an end located on the inner wall surface 512a to communicate with the transverse through hole of the second through hole 613 and another end bent downward to locate on the connecting wall surface 512c. The air in the air chamber 621 can still communicate with ambient air via the first and the second through hole 514, 613, giving the air chamber 621 and accordingly, the foot pad structure 6 a high compressibility.

Figure 11:
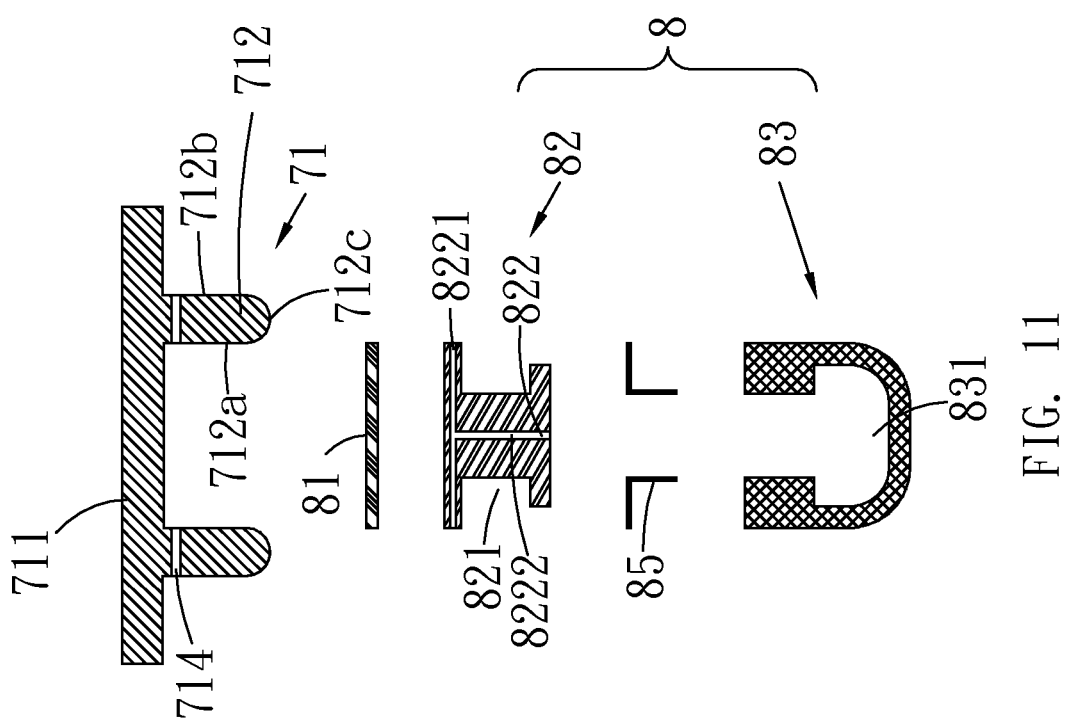
FIG. 11 is an exploded sectional view of a foot pad structure according to a fourth embodiment of the present invention.
Figure 12:
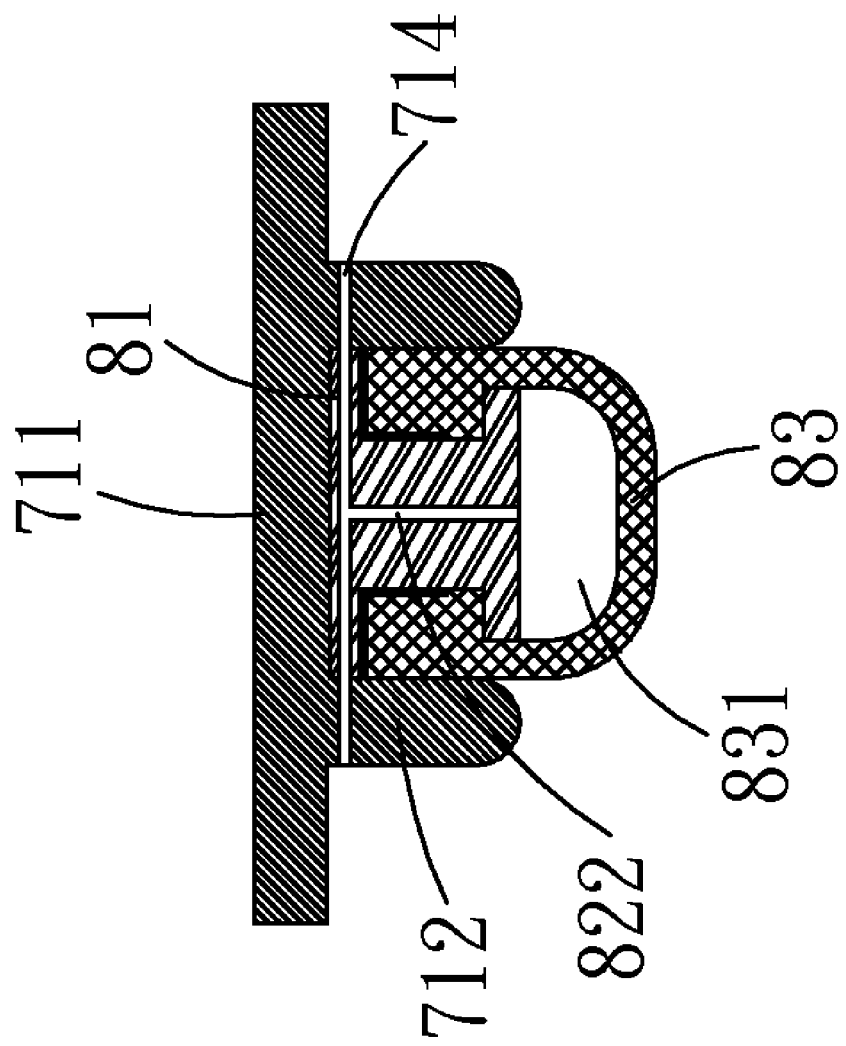
FIG. 12 is an assembled view of FIG. 11.

FIGS. 11 and 12 are exploded and assembled sectional views, respectively, of a foot pad structure according to a fourth embodiment of the present invention. In the illustrated fourth embodiment, the electronic system (not shown) has a plurality of receiving portions 71 provided on a bottom of a base portion thereof. Each of the receiving portions 71 includes, in addition to the base wall 711, a surrounding wall 712 and a first through hole 714. The surrounding wall 712 includes an inner wall surface 712a, an outer wall surface 712b, and a connecting wall surface 712c. The foot pad structure 8 includes a binding member 81, a retaining member 82, an elastic pad member 83, and a gluing material 85. The elastic pad member 83 defines an air chamber 831 therein. The retaining member 82 has a locating recess 821 and a second through hole 822.

In the illustrated fourth embodiment, the base wall 711, the surrounding wall 712 and the connecting wall surface 712c of the receiving portion 71, the locating recess 821 of the retaining member 82, the elastic pad member 83, and the gluing material 85 are structurally and functionally similar to the second embodiment and are therefore not described in details herein.

The fourth embodiment is different from the second embodiment in that the first through hole 714 is extended through the surrounding wall 712 in a thickness direction thereof to locate between the inner wall surface 712a and the outer wall surface 712b, and that the second through hole 822 comprising a transverse through hole 8221 and a vertical through hole 8222. The transverse through hole 8221 transversely extends through between two opposite sidewalls at an upper end of the retaining member 82 to communicate with the first through hole 714, and the vertical through hole 8222 longitudinally extends between the transverse through hole 8221 and a lower end of the retaining member 82, such that air in the air chamber 831 is communicable with ambient air via the first and the second through hole 714, 822, allowing the foot pad structure 8 to serve as an air cushion and provide a high compressibility.

Figure 13:
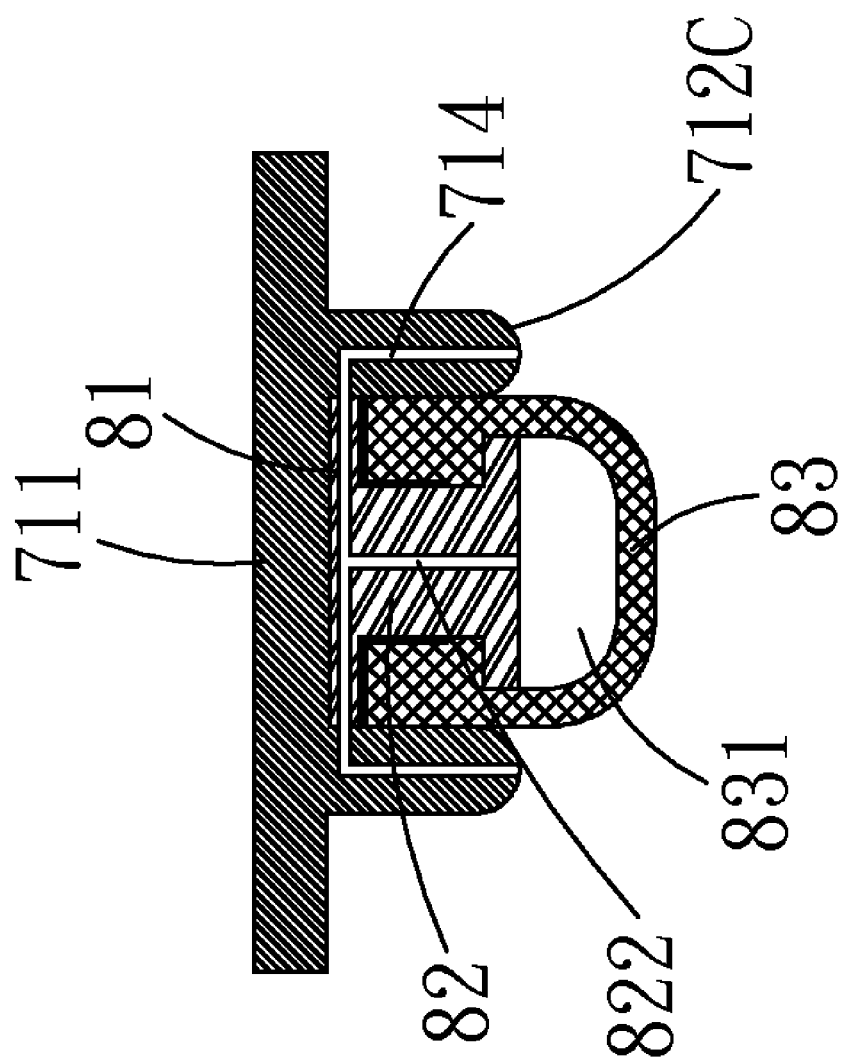
FIG. 13 is an assembled sectional view showing a first variation of the fourth embodiment of the present invention.

Please refer to FIG. 13 that shows a first variation of the fourth embodiment of the present invention. In this first variation of the fourth embodiment, the first through hole 714 has an end located on the inner wall surface 712a and another end bent downward to locate on the connecting wall surface 712c. With these arrangements, the air in the air chamber 831 can still communicate with ambient air via the first and the second through hole 714, 822.

Figure 14:
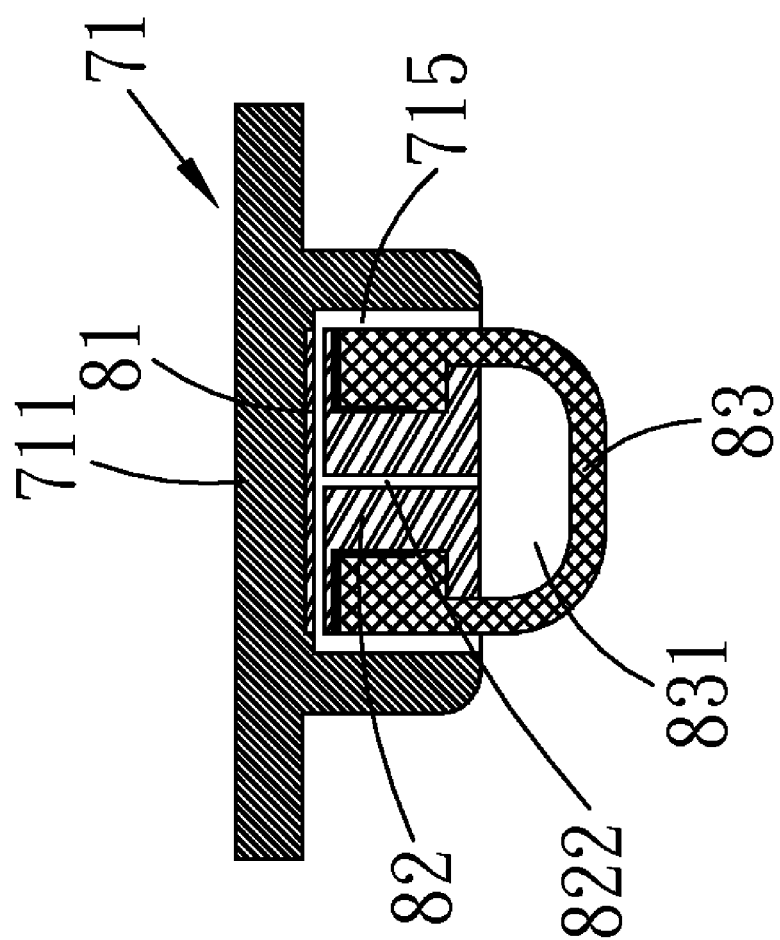
FIG. 14 is an assembled sectional view showing a second variation of the fourth embodiment of the present invention.

FIG. 14 shows a second variation of the fourth embodiment of the present invention. Since the second variation of the fourth embodiment is generally structurally and functionally similar to the first variation of the fourth embodiment, only the difference between the two variations is described herein. The second variation is different from the first variation in that the first through hole 714 is omitted from the receiving portion 71 and that at least one longitudinally extended groove 715 is formed on the inner wall surface 712a of the surrounding wall 712. The groove 715 extends between the second through hole 822 and the connecting wall surface 712c to communicate the second through hole 822 with external environment. When the elastic pad member 83 is fitted in the receiving portion 71 via the retaining member 82 and the binding member 81, air can flow into or out of the air chamber 831 in the elastic pad member 83 via the second through hole 822 and the groove 715.

With the air chamber provided in the elastic pad member and the through holes provided on the retaining member and the receiving portion to communicate the air chamber with external environment, the foot pad structure of the present invention can function as an air cushion. Therefore, when the elastic pad member is compressed by an external force, part of the air stored in the air chamber can be expelled into the external environment via the communicating through holes, allowing the elastic pad member to have high compressive deformation. That is, every foot pad structure of the present invention is able to have appropriate compressive deformation rate corresponding to a distance between the foot pad structure and a work surface, so that the electronic system having the foot pad structure of the present invention mounted to a bottom thereof can always be stably positioned on a work surface for operation.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A foot pad structure for mounting to a receiving portion of an electronic system, the receiving portion having a base wall, a surrounding wall and a first through hole, the surrounding wall being outward extended from the base wall, and the first through hole being extended through the receiving portion, the foot pad structure comprising:
   a retaining member being mounted to the receiving portion and being provided with a second through hole communicable with the first through hole; and
   an elastic pad member being a hollow member having a top opening, the elastic pad member being fitted around the retaining member via the top opening, and an elastic compressible portion being formed below the top opening, the compressible portion being protruded beyond the receiving portion when the retaining member is mounted to the receiving portion, and an air chamber communicable with the second through hole being formed in the compressible portion.

2. The foot pad structure as claimed in claim 1, wherein the base wall inside the surrounding wall is provided with at least one position limiting hole, and the retaining member is correspondingly provided on an upper end surface with at least one upward protruded retaining pin for inserting into the position limiting hole, the retaining pin being heat molten to become deformed for filling up the position limiting hole, whereby when the molten retaining pin is cooled and set again, the retaining member is firmly held to the receiving portion.

3. The foot pad structure as claimed in claim 2, wherein the position limiting hole has a neck portion and a flared portion, and the retaining pin being extended through the neck portion, so that the heated and molten retaining pin fills up the flared portion of the position limiting hole.

4. The foot pad structure as claimed in claim 1, wherein the first through hole is extended through the base wall in a thickness direction thereof, and the second through hole is extended through between the upper end surface and a lower end surface of the retaining member to communicate with the first through hole.

5. The foot pad structure as claimed in claim 1, wherein the first through hole is extended through the surrounding wall in a thickness direction thereof, and the second through hole comprising a transverse through hole and a vertical through hole, the transverse through hole being transversely extended between two opposite sidewall surfaces at an upper end of the retaining member to communicate with the first through hole, the vertical through hole being longitudinally extended between the transverse through hole and a lower end of the retaining member, and the air chamber being communicable with external environment via the first through hole and the transverse and vertical through holes of the second through hole.

6. The foot pad structure as claimed in claim 1, wherein the retaining member is externally provided around a sidewall with a locating recess, and the elastic pad member is provided along an inner periphery of the top opening with a radially inward protruded locating portion for engaging with the locating recess on the retaining member.

7. The foot pad structure as claimed in claim 1, wherein the first through hole has an end located on the inner wall surface and another end bent toward to locate on the connecting wall surface, and wherein the second through hole comprising a transverse through hole and a vertical through hole, the transverse through hole being transversely extended between two opposite sidewall surfaces at an upper end of the retaining member to communicate with the first through hole, the vertical through hole being longitudinally extended between the transverse through hole and a lower end of the retaining member, and the air chamber being communicable with external environment via the first through hole and the transverse and vertical through holes of the second through hole.

8. A foot pad structure for mounting to a receiving portion provided of an electronic system, the receiving portion having a base wall and a surrounding wall, and the surrounding wall being outward extended from the base wall and being provided on an inner wall surface thereof with an longitudinally extended groove, the foot pad structure comprising:
a retaining member being mounted to the receiving portion and being provided with a second through hole communicable with the groove; and
an elastic pad member being a hollow member having a top opening, the elastic pad member being fitted around the retaining member via the top opening, and an elastic compressible portion being located below the top opening, the compressible portion being protruded beyond the receiving portion when the retaining member is mounted to the receiving portion, and an air chamber communicable with the second through hole being formed in the compressible portion.

9. The foot pad structure as claimed in claim 8, wherein the base wall inside the surrounding wall is provided with at least one position limiting hole, and the retaining member is correspondingly provided on an upper end surface with at least one upward protruded retaining pin for inserting into the position limiting hole, the retaining pin being heat molten to become deformed for filling up the position limiting hole, whereby when the molten retaining pin is cooled and set again, the retaining member is firmly held to the receiving portion.

10. The foot pad structure as claimed in claim 9, wherein the position limiting hole has a neck portion and a flared portion, and the retaining pin being extended through the neck portion, so that the heated and molten retaining pin fills up the flared portion of the position limiting hole.

11. The foot pad structure as claimed in claim 8, wherein the second through hole comprising a transverse through hole and a vertical through hole, the transverse through hole being transversely extended between two opposite sidewall surfaces at an upper end of the retaining member to communicate with the groove, the vertical through hole being longitudinally extended between the transverse through hole and a lower end of the retaining member, and the air chamber being communicable with external environment via the groove and the transverse and vertical through holes of the second through hole.

12. The foot pad structure as claimed in claim 8, wherein the retaining member is externally provided around a sidewall with a locating recess, and the elastic pad member is provided along an inner periphery of the top opening with a radially inward protruded locating portion for engaging with the locating recess on the retaining member.

13. An electronic system, comprising:
a housing;
a receiving portion provided on a bottom of the housing, comprising:
a base wall;
a surrounding wall being downward extended from the base wall; and
a first through hole being extended through the receiving portion; and
a foot pad structure, comprising:
a retaining member being mounted to the receiving portion and being provided with a second through hole communicable with the first through hole; and
an elastic pad member being a hollow member having a top opening, the elastic pad member being fitted around the retaining member via the top opening, and an elastic compressible portion being located below the top opening, the compressible portion being protruded beyond the receiving portion when the retaining member is mounted to the receiving portion, and an air chamber being formed in the compressible portion.

14. The electronic system as claimed in claim 13, wherein the base wall inside the surrounding wall is provided with at least one position limiting hole, and the retaining member is correspondingly provided on an upper end surface with at least one upward protruded retaining pin for inserting into the position limiting hole, the retaining pin being heat molten to become deformed for filling up the position limiting hole, whereby when the molten retaining pin is cooled and set again, the retaining member is firmly held to the receiving portion.

15. The electronic system as claimed in claim 14, wherein the position limiting hole has a neck portion and a flared portion, and the retaining pin being extended through the neck portion, so that the heated and molten retaining pin fills up the flared portion of the position limiting hole.

16. The electronic system as claimed in claim 13, wherein the first through hole is extended through the base wall in a thickness direction thereof, and the second through hole is extended through between the upper end surface and a lower end surface of the retaining member to communicate with the first through hole.

17. The electronic system as claimed in claim 13, wherein the first through hole is extended through the surrounding wall in a thickness direction thereof, and the second through hole comprising a transverse through hole and a vertical through hole, the transverse through hole being transversely extended between two opposite sidewall surfaces at an upper end of the retaining member to communicate with the first through hole, the vertical through hole being longitudinally extended between the transverse through hole and a lower end of the retaining member, and the air chamber being communicable with external environment via the first through hole and the transverse and vertical through holes of the second through hole.

18. The electronic system as claimed in claim 13, wherein the retaining member is externally provided around a sidewall with a locating recess, and the elastic pad member is provided along an inner periphery of the top opening with a radially inward protruded locating portion for engaging with the locating recess on the retaining member.

19. The electronic system as claimed in claim 13, wherein the first through hole has an end located on the inner wall surface and another end bent toward to locate on the connecting wall surface, and wherein the second through hole comprising a transverse through hole and a vertical through hole, the transverse through hole being transversely extended between two opposite sidewall surfaces at an upper end of the retaining member to communicate with the first through hole, the vertical through hole being longitudinally extended between the transverse through hole and a lower end of the retaining member, and the air chamber being communicable with external environment via the first through hole and the transverse and vertical through holes of the second through hole.

* * * * *